ELECTRONIC FILTER WITH ACTIVE ELEMENTS

Filed Feb. 4, 1959 3 Sheets-Sheet 1

HAROLD D. MORRIS
INVENTOR.

BY Flehr & Swain
ATTORNEYS

Feb. 25, 1964 H. D. MORRIS 3,122,714

ELECTRONIC FILTER WITH ACTIVE ELEMENTS

Filed Feb. 4, 1959 3 Sheets-Sheet 2

HAROLD D. MORRIS
INVENTOR

BY [signature]
ATTORNEYS

Feb. 25, 1964 H. D. MORRIS 3,122,714

ELECTRONIC FILTER WITH ACTIVE ELEMENTS

Filed Feb. 4, 1959 3 Sheets-Sheet 3

HAROLD D. MORRIS
*INVENTOR.*

BY Flehr & Swain

ATTORNEYS

United States Patent Office 3,122,714
Patented Feb. 25, 1964

3,122,714

ELECTRONIC FILTER WITH ACTIVE ELEMENTS

Harold D. Morris, Pleasant Hills, Calif., assignor, by mesne assignments, to Systron-Donner Corporation, Concord, Calif., a corporation of California Filed Feb. 4, 1959, Ser. No. 791,210
8 Claims. (Cl. 330—181)

This invention relates to an electronic filter and more particularly to an electronic filter which has a response of the second order or higher.

There has been a long felt need for a filter having a second order or higher order response which has no D.-C. drift and which has an adjustable damping ratio.

In general, it is an object of this invention to provide an electronic filter which has a response of the second order or higher order with no D.-C. drift.

Another object of the invention is to provide an electronic filter of the above character which has an adjustable damping ratio.

Another object of the invention is to provide an electronic filter of the above character which makes possible the simulation of second order and higher order systems and the simulation of any desired damping ratio.

Another object of the invention is to provide an electronic filter of the above character which passes only low frequencies and eliminates all frequency components above a predetermined frequency.

Another object of the invention is to provide an electronic filter of the above character which can be cascaded.

Another object of the invention is to provide a cascaded electronic filter of the above character where one stage has little effect on the other stage or stages.

Another object of the invention is to provide a cascaded filter of the above character in which responses of the fourth order and higher can be obtained.

Another object of the invention is to provide a cascaded filter of the above character in which one or more of the stages is overdamped and one or more of these stages is underdamped to give an overall flat response.

Another object of the invention is to provide an electronic filter of the above character which is compact, light in weight and easy to manufacture.

Additional objects and features of the invention will appear from the following embodiments which are shown in detail in the accompanying drawings.

Referring to the drawings.

In general, the electronic filter incorporating the present invention consists of resistance and capacitance means connected between input and output terminals. Amplifier means is connected to the capacitance means and is provided with feedback means which causes the amplifier means to form a derivative of the output signal and to apply this to the capacitive means so that frequency variances appearing in the output will be immediately opposed and nullified by the signals applied by the amplifier means to the capacitance means.

Figures 1, 2, 4:
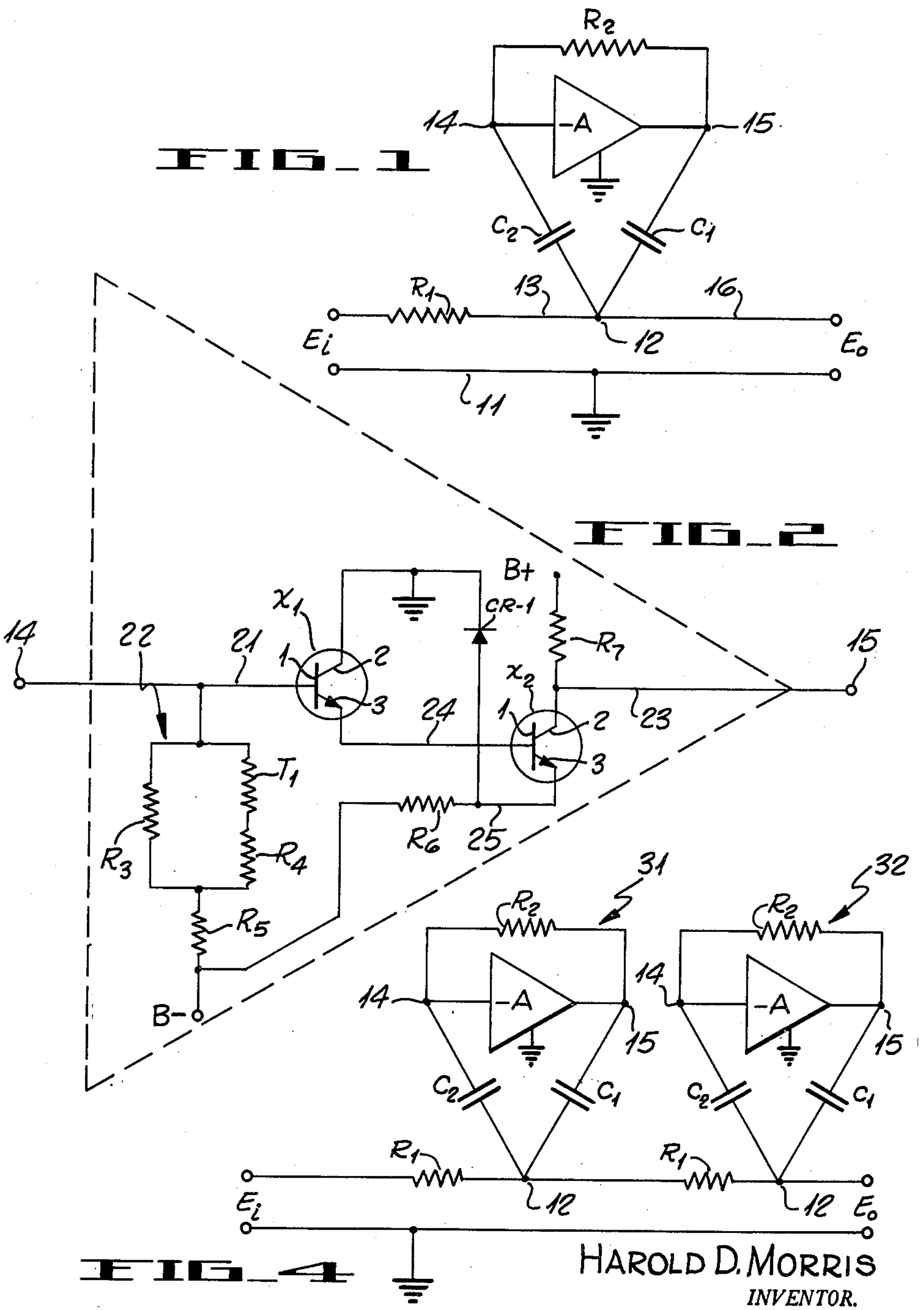
FIGURE 1 is a circuit diagram, partly in block form, of an electronic filter incorporating the present invention.
FIGURE 2 is a circuit diagram of the amplifier shown in block form in FIGURE 1.
FIGURE 4 is a circuit diagram, partly in block form, of a cascaded electronic filter of the fourth order incorporating the present invention.

The electronic filter shown in FIGURE 1 is a single section second order filter and consists of a pair of input terminals which are labelled $E_i$ and a pair of output terminals which are labelled $E_o$. The lowermost terminals of the input and output terminals are connected by a conductor 11 which is grounded as shown. The ungrounded input terminal is connected to one side of a resistance R1, and the other side of the resistance R1 is connected to a junction 12 by a conductor 13. The junction 12 is connected to one side of a capacitance C2, and the other side of the capacitance C2 is connected to the input terminal 14 of an amplifier which has been labellel A. The output terminal 15 of the amplifier is connected to one side of a capacitance C1, and the other side of the capacitance C1 is connected to the junction 12. The junction 12 is connected to the undergrounded output terminal by a conductor 16. A resistance R2 is connected between the input and output terminals of the amplifier A, as shown.

The circuit diagram for the amplifier A is shown in FIGURE 2 and consists of two transistors X1 and X2, each having base, collector and emitter elements 1, 2 and 3. It also consists of resistors R3, R4, R5, R6 and R7, and a thermistor T1. The base of the transistor X1 is connected to the input terminal 14 for the amplifier by a conductor 21. The base is connected to one end of a biasing network 22 which consists of the resistor R3 connected in parallel with the serially connected thermistor T1 and the resistor R4. The other end of the network 22 is connected to one side of a voltage dropping resistor R5, and the other side of the voltage dropping resistor is connected to the B— terminal as shown. The B— terminal is also connected to one side of a voltage dropping resistance R6, and the other side of the resistance R6 is connected by conductor 25 to the emitter 3 of the transistor X2. The anode of Zener diode CR1 is connected to conductor 25 and its cathode is connected to ground as shown. The diode CR1 serves to supply a signal reference for the grounded emitter stage for transistor X2. The collector 2 of transistor X2 is connected to one side of a resistance R7, and the other side of the transistance R7 is connected to the B+ supply. The collector 2 of the transistor X2 is also connected to the output terminal 15 of the amplifier by a conductor 23. The base 1 of transistor X2 is connected to the emitter 3 of the transistor X1 by a conductor 24. The collector of the transistor X1 is connected to ground as shown.

The operation of the amplifier is substantially conventional. The transistor X2 and its associated circuitry is a grounded emitter stage which drives the collector resistor R7 connected to the B+ power supply. The transistor X1 is driven by the transistor X2 and acts as an emitter follower which is biased by the network 22. The network 22 is provided with the thermistor T1 to provide temperature compensation so that the amplifier will be stable over a wide ambient temperature range.

As is well known to those skilled in the art, the D.-C. gain of transistors varies with temperature. Transistors have a tendency to have a variable collector current which varies as a function of temperature when the drive remains constant. Therefore, when a rise in temperature occurs, the gain of the transistor increases and the current required to operate the transistor decreases. The thermistor T1, on the other hand, has a very high negative temperature coefficient which decreases in value as the temperature rises and, therefore, causes the current flowing away from the base junction of the transistor X1 to increase which has the effect of decreasing the collector current. The thermistor, therefore, maintains the stability of the transistor. The temperature coefficient of the thermistor T1 is properly adjusted to the transistor by the resistors R3 and R4.

Operation of the single section second order filter shown in FIGURE 1 may now be briefly described as follows. Let it be assumed that capacitor C2 is not in the system, that is, C2 equals zero. When this is the case, resistor R1 and capacitor C1 act as a simple RC filter network with the upper end of the capacitor C1 effectively grounded for signal purposes by the low output impedance of the amplifier A. Such an RC filter network would act as a low pass filter of the first order.

The resistor R2 and bias network 22 effectively stabilize the D.-C. amplifier A. If the capacitors C1 and C2 are disconnected, the amplifier A and the resistor R2 and associated bias networks 22 will act as a negative feedback amplifier with a resistive feedback. With such a condition, there will be negative feedback to the input of the amplifier and the amplifier will, therefore, immediately try to regulate the current in resistor R2 to closely equal the bias current so that the error signal applied to the input of the amplifier will be minimized. Thus, the amplifier A remains normally fed back as far as zero frequency is concerned and is resting in its mid range, as properly determined by bias current, and maintained there under various conditions of ambient temperature by thermistor compensation.

Now let it be assumed that the capacitor C2 has been added to the system. The capacitor C2 adds another component to the feedback for the amplifier A and, therefore, the feedback for the amplifier now consists of two components supplied by the resistor R2 and the capacitor C2. When supplied with such a feedback, the amplifier A acts to form the derivative of the output signal $E_O$ and applies this to the upper end of the capacitor C1. The phasing is such that high frequency variations occurring in the output will be immediately opposed and nullified by the signal applied to the capacitor C1 by the amplifier.

Expressed in another manner, the capacitor C2 senses any change in the output voltage $E_O$. This change is amplified and reversed in phase by the amplifier and fed through the capacitor C1 to effectively oppose any instantaneous change of the signal output.

Still another way of looking at the operation of the filter is to consider the application of a step input to the input terminals $E_i$. With the output at zero, such a step immediately causes the current flow in resistance R1 to jump to a high value. This current comes to the junction 12 and begins flowing through the capacitors C1 and C2 charging them positively. However, current flowing in capacitor C2 also immediately causes shifting of the voltage applied to input terminal 14 of the high gain amplifier A which causes the amplifier to drop its output voltage and, therefore, the voltage applied to the capacitor C1 is in such a manner that most of the current flowing through the resistance R1 must flow through capacitor C1 rather than C2. This feedback current effectively nullifies any instantaneous change in the potential of junction 12.

Figure 3:
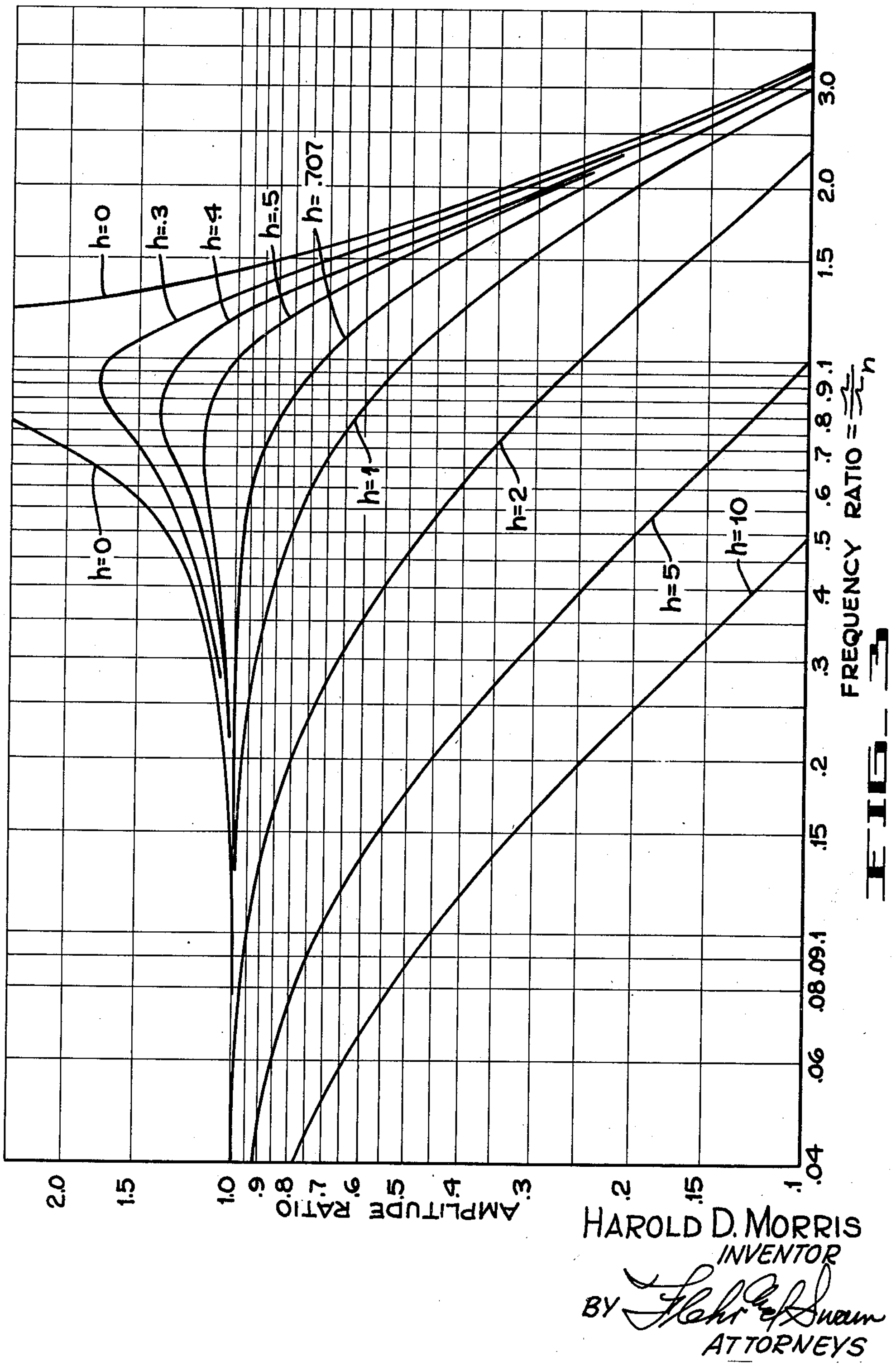
FIGURE 3 is a graph showing the typical response of an electronic filter of the second order to an applied sinusoidal disturbance.

The curves shown in FIGURE 3 give a graphical picture of the response of a typical second order system such as that shown in FIGURE 1 with an applied sinusoidal input. The curve formed by the amplitude of the output versus frequency varies depending upon the damping ratio actually utilized in the second order system. The curves shown in FIGURE 3 actually describe any second order system in which the $h$'s are damping ratios compared with the critical damping. Thus, when $h$ is equal to zero, we have a zero damped system which means that the amplitude goes to infinity as the natural frequency is reached which is indicated as unity on the graph shown in FIGURE 3. A damping ratio of 1 is known as critical damping and is the first time that there is no overshoot in the transient response of the system.

The damping ratio is selected by adjustment of resistor values in the filter. For example, in achieving particular damping ratio, the resistance R2 can be adjusted by padding it with the padding resistors until the desired damping ratio is obtained. For example, it can be adjusted to obtain optimum flatness from the filter. Normally, a potentiometer is not utilized to obtain such an adjustment because a potentiometer is not sufficiently reliable for many practical applications.

By way of example, one embodiment of the hereinbefore described filter which was found to operate very satisfactorily had the following values for its components.

| | |
|---|---|
| Resistors: | |
| R1 | 15K. |
| R2 | 150K. |
| R3 | 180K. |
| R4 | 180K. |
| R5 | 110K. |
| R6 | 3.3K. |
| R7 | 7.5K. |
| Diodes: CR1 | Type ZA15 (Hoffman). |
| Capacitors: | |
| C1 | 1.0 microfarad. |
| C2 | 0.5 microfarad. |
| Transistors: X1 and X2 | Type No. 2N332 (Texas Instruments). |
| Thermistor T1 | Type No. GA 51 J1 (Fenwal). |
| Voltages: | |
| B− | −30 volts. |
| B+ | +15 volts. |

The filter constructed with these components was found to be drift free with great flexibility of adjustment for natural frequency and damping. It was found that all frequency components above approximately two cycles per second were eliminated.

One of the features of the filter found to be particularly desirable was that the input junction to the amplifier need not be at the same potential as the output junction of the amplifier. For example, in the above embodiment, it was found that the input junction of the amplifier A could be operated at −15 volts while the output voltage remained at approximately zero. Since amplifier drift does not result in output drift, there is no particular requirement that the output voltage from the amplifier remain within a particular range of zero except to permit the output of the amplifier to swing so that it will be capable of performing its normal function in the filter. In other words, even though D.-C. drift is not important as such, it is objectionable because it can change the saturation range of the output amplifier with limiting effects upon the allowable input to the filter. This possibility is minimized by the thermistor bridge and the input biasing by the network 22.

Another embodiment of my invention is shown in FIGURE 4 and consists of a fourth order system. Such a fourth order system as shown is actually comprised of two cascaded second order systems of the type shown in FIGURE 1. The two second order systems are designated as stages 31 and 32. The impedances of the two stages are ratioed approximately 10 to 1 so that the second stage will have very little effect on the first stage as far as modifying its transfer function.

Figure 5:
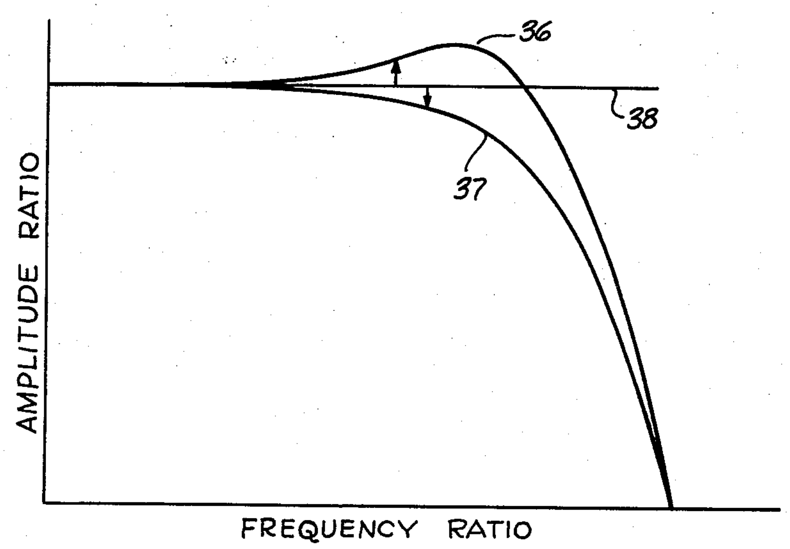
FIGURE 5 is a graph showing the output of the filter shown in FIGURE 4.

Operation of this filter is very similar to that described for FIGURE 1 with the exception that the two stages 31 and 32 can be operated in such a manner that an optimum fast cut-off filter can be provided. The highest speed cut-off filter is obtained by operating one stage as an underdamped second order system and the other stage as an overdamped second order system so that the product of the two represents the optimum cut-off rate. This is demonstrated in the graph shown in FIGURE 5 in which curve 36 represents the output from the underdamped stage and curve 37 represents the output from the overdamped stage. Curve 38 represents the actual output from the combination of the two stages to give the fastest cut-off rate for the fourth order filter.

Figure 6:
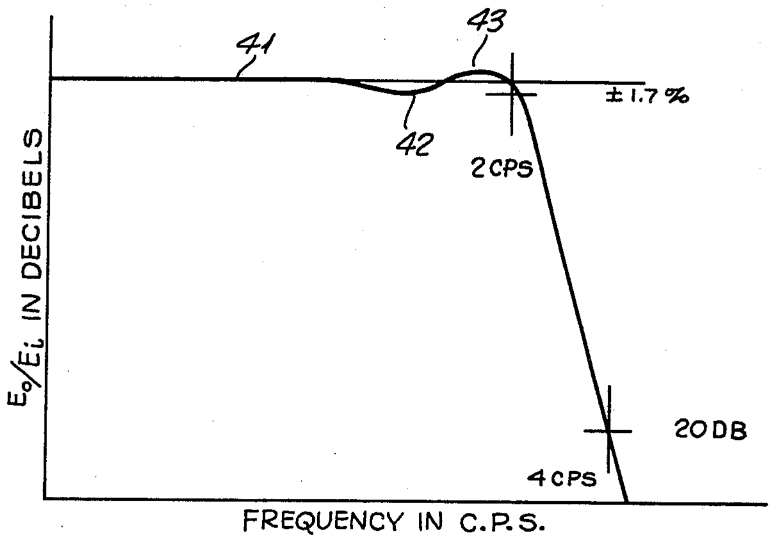
FIGURE 6 is a graph showing the overall frequency response of the filter shown in FIGURE 4.

The bandpass of such a fourth order system is very close to flat as shown by the curve 41 in FIGURE 6. However, it will be noted that the curve takes a slight dip at 42 before the natural frequency of either stage and then makes a small rise as shown at 43 and then cuts off very sharply.

In one embodiment of the invention, the filter was found to have a characteristic which was flat within plus or minus 1.7% out to two cycles per second. The output dropped off at a rate of 24 decibels per octave above two cycles per second, and at four cycles per second the attenuation was approximately 20 db.

It is apparent from the foregoing that I have provided an electronic filter which has a second order response and when cascaded has higher orders of response such as a fourth order response. The filter is drift free and has a great flexibility of adjustment for natural frequency and damping. It is constructed of such components which make possible a compact and light assembly. When used in a fourth order system, a very flat characteristic is obtained with a maximum cut-off rate. Although the filter has been described with a transistor amplifier, it is apparent that a vacuum tube amplifier may be used in place thereof if desired.

I claim:

1. In an electronic filter of the second order type for filtering an input signal having a D.-C. component, the electronic filter comprising a pair of input terminals and a pair of output terminals, a voltage supply connected to the input terminals, amplifier means having a common reference terminal, a junction terminal connected to one of the output terminals, a first resistor connected between one of the input terminals and the junction terminal to supply a current signal at the junction terminal, a first capacitor connected between the junction terminal and the output of the amplifier means, a second capacitor connected between the junction terminal and the input of the amplifier means, a second resistor connected between the output of the amplifier and the input of the amplifier, means connecting the other input terminal to the other output terminal, said output terminals being connected to said input terminals so that a D.-C. component in the input signal passes through the filter, and means connecting said common reference terminal of said amplifier means to said other output terminal so that the amplifier is referenced to said other output terminal, said amplifier means in combination with said second capacitor and said second resistor serving to provide a signal which is an inverted derivative of the output signal appearing at the output terminals to nullify sudden variations occurring in the output signal.

2. An electronic filter as in claim 1 wherein said amplifier means consists of a two stage transistor amplifier, one stage being operated as a grounded-emitter stage and the other stage being operated as an emitter-follower stage, and means connected to the emitter-follower stage to compensate for the effects of temperature variations.

3. In an electronic filter for filtering an input signal having a D.-C. component, a plurality of cascaded second order stages, each of the stages having an input and an output in which the input is isolated from the output and with the output of a preceding stage directly connected to the input of a succeeding stage, each of the stages being comprised of an amplifier having a common reference point which is connected to the output so that the amplifier is referenced to the output, a differentiating network connecting the output of the amplifier to the input of the amplifier, and another network connecting the output of the amplifier to the input of the amplifier, a point of the differentiating network being connected to the output of the stage, the amplifier in combination with said networks providing a signal which is an inverted derivative of the signal appearing at the output of said stage and serving to nullify sudden variations occurring in the last named signal, the output of each stage being connected to the input of the same stage so that the stage will pass any D.-C. component in the input signal.

4. An electronic filter as in claim 3 wherein at least two cascaded stages are provided and in which one of the two stages is operated as an overdamped second order system and wherein the other of said two stages is operated as an underdamped second order system to thereby give a predetermined cut-off rate for the filter.

5. In an electronic filter of the second order type for filtering an input signal having a D.-C. component, the filter comprising pairs of input and output terminals with the input signal being applied to the input terminals, an amplifier having an input and an output and a common reference terminal, impedance means connecting one of the input terminals to one of the output terminals, additional means connecting the other input terminal to the other output terminal, means connecting said common reference terminal of the amplifier to said other output terminal, said impedance means and said additional means being capable of passing any D.-C. component in the input signal, feedback means connecting the output of the amplifier to the input of the amplifier, said feedback means consisting of at least first and second feedback paths, and means connecting a point on one of said paths to said one output terminal, said feedback paths supplying a combined feedback signal to the input of the amplifier, the combined feedback signal being comprised of two components, one component being a current signal proportional to the output signal of the amplifier and the other component being a current signal proportional to the rate of change of the output voltage on said one output terminal of the filter to provide a derivative of the output voltage, the amplifier serving to amplify and invert the derivative of the output voltage from the filter, the inverted derivative of the output voltage of the filter being applied to said one output terminal of the filter so that variations occurring in the output voltage of the filter are nullified.

6. In an electronic filter of the second order type for filtering an input signal having a D.-C. component, the filter comprising pairs of input and output terminals having the input signal connected to the input terminals, an amplifier having an input and an output and a common reference terminal, a resistor connected betwen the output and the input of the amplifier and applying a current feedback signal to the input of the amplifier, a capacitor network connected between the output and the input of the amplifier and applying a voltage feedback signal, the capacitor network having a junction terminal with at least one capacitor on each side of the junction terminal, impedance means connecting one of the input terminals of the filter to the junction terminal of the capacitor networks, conducting means connecting the junction terminal of the capacitor network to one of the output terminals of the filter, conducting means connecting the other of the input terminals to the other of the output terminals, and means connecting the common reference terminal of the amplifier to said other output terminal so that the amplifier is referenced to said other output terminal.

7. In an electronic filter as in claim 6 wherein one of said capacitors on one side of the junction terminal serves as a 90° phase shifting input means and wherein the one of the capacitors on the other side of the junction terminal serves as a 90° phase shifting output means.

8. In an electronic filter of the second order type for filtering an input signal having a D.-C. component, the filter comprising an input and an output in which the input is isolated from the output, an amplifier having a common reference point which is connected to the output so that the amplifier is referenced to the output, a differentiating network connecting the output of the amplifier to the input of the amplifier, and another network connecting the output of the amplifier to the input of the amplifier, a point of the differentiating network being connected to the output of the filter, the amplifier in combination with said networks providing a signal which is an inverted derivative of the signal appearing at the output of the filter and serving to nullify sudden variations occurring in the signal appearing at the output of the filter.

References Cited in the file of this patent

UNITED STATES PATENTS

| | | |
|---|---|---|
| 1,985,353 | Rhodes | Dec. 25, 1934 |
| 2,251,973 | Beale et al. | Aug. 12, 1941 |
| 2,435,195 | Bomberger et al. | Feb. 3, 1948 |
| 2,843,671 | Wilkins et al. | July 15, 1958 |
| 2,846,577 | Blasingame | Aug. 5, 1958 |
| 2,858,379 | Stanley | Oct. 28, 1958 |
| 2,860,195 | Stanley | Nov. 11, 1958 |
| 2,887,532 | Werner | May 19, 1959 |
| 2,938,170 | Berry | May 24, 1960 |